US012592277B2

(12) United States Patent
    Gupta

(10) Patent No.:  US 12,592,277 B2
(45) Date of Patent:       Mar. 31, 2026

(54) DISTRIBUTED WRITE DRIVER FOR MEMORY ARRAY

(71) Applicant: IMEC VZW, Leuven (BE)

(72) Inventor: Mohit Gupta, Heverlee (BE)

(73) Assignee: IMEC VZW, Leuven (BE)

( * ) Notice: Subject to any disclaimer, the term of this patent is extended or adjusted under 35 U.S.C. 154(b) by 140 days.

(21) Appl. No.: 18/515,812

(22) Filed: Nov. 21, 2023

(65) Prior Publication Data

US 2024/0170051 A1     May 23, 2024

(30) Foreign Application Priority Data

Nov. 22, 2022    (EP) ..................................... 22208717

(51) Int. Cl.
    *G11C 11/4096*      (2006.01)
    *G11C 5/06*         (2006.01)
    *G11C 11/4076*      (2006.01)
(52) U.S. Cl.
    CPC .......... *G11C 11/4096* (2013.01); *G11C 5/063* (2013.01); *G11C 11/4076* (2013.01)
(58) Field of Classification Search
    CPC . G11C 11/4096; G11C 5/063; G11C 11/4076; G11C 29/021; G11C 29/028; G11C 5/025; G11C 7/12; G11C 8/08; G11C 11/1655; G11C 11/1657; G11C 13/0033; G11C 2029/0409; G11C 13/0028; G11C 13/0026
    USPC .................................................... 365/189.011
    See application file for complete search history.

(56) References Cited

U.S. PATENT DOCUMENTS

| | | | |
|---|---|---|---|
| 5,757,703 A | 5/1998 | Merritt et al. | |
| 9,478,273 B2 | 10/2016 | Dray et al. | |
| 2010/0020618 A1 | 1/2010 | Kim et al. | |
| 2012/0014174 A1 | 1/2012 | Rao et al. | |
| 2014/0043887 A1* | 2/2014 | Lym ......................... | G11C 7/02 365/158 |
| 2017/0278556 A1 | 9/2017 | Antonyan | |
| 2019/0013811 A1 | 1/2019 | Tsuji et al. | |
| 2019/0164596 A1 | 5/2019 | Lee et al. | |
| 2020/0020378 A1 | 1/2020 | Wei et al. | |

OTHER PUBLICATIONS

Extended European Search Report dated Apr. 3, 2023 in European Application No. 22208717.3, in 7 pages.

(Continued)

*Primary Examiner* — Huan Hoang
(74) *Attorney, Agent, or Firm* — Knobbe Martens Olson & Bear, LLP

(57) ABSTRACT

The disclosed technology relates to a write driver and a method for operating the write driver for a memory device. The write driver is connected to a memory line of the memory device. Multiple memory cells of the memory device are connected to the memory line at different distances from the write driver. The operating method comprises controlling the write driver to provide a smaller amount of current for accessing a first memory cell of the memory cells, and controlling the write driver to provide a larger amount of current for accessing a second memory cell of the memory cells. Thereby, the first memory cell is connected to the memory line at a smaller distance to the write driver than the second memory cell.

16 Claims, 8 Drawing Sheets

(56) References Cited

OTHER PUBLICATIONS

Agarwal et al., "Energy Scaling Advantages of Resistive Memory Crossbar Based Computation and Its Application to Sparse Coding", Frontiers in Neuroscience, Jan. 2016, vol. 9, Article 484, 9 pages.

Amirsoleimani et al., "In-Memory Vector-Matrix Multiplication in Monolithic CMOS-Memristor Integrated Circuits: Design Choices, Challenges, and Perspectives", Advanced Intelligent Systems, 2020, 2 (11), 29 pages.

Chowdhuryy et al., "LADDER: Architecting Content and Location-aware Writes for Crossbar Resistive Memories", MICRO '21, Oct. 18-22, 2021, Virtual Event, Greece, 14 pages.

Wang et al., "Design of Low Power 3D Hybrid Memory by Non-volatile CBRAM-Crossbar with Block-level Data-retention", ISLPED'12, Jul. 30-Aug. 1, 2012, Redondo Beach, CA, USA, 6 pages.

Wen, "Improving Performance and Endurance for Crossbar Resistive Memory", Doctor of Philosophy Dissertation presented Jun. 19, 2020, University of Pittsburgh, Swanson School of Engineering, 140 pages.

Xu et al., "Overcoming the Challenges of Crossbar Resistive Memory Architectures", 2015 IEEE 21st International Symposium on High Performance Computer Architecture (HPCA), Burlingame, CA, USA, 2015, pp. 476-488.

Zhang et al., "EnTiered-ReRAM: An Enhanced Low Latency and Energy Efficient TLC Crossbar ReRAM Architecture", IEEE Access, vol. 9, pp. 167173-167189, 2021.

Zhao et al., "Crossbar Architecture Based on 2R Complementary Resistive Switching Memory Cell", NANOARCH '12: Proceedings of the 2012 IEEE/ACM International Symposium on Nanoscale Architectures, Jul. 2012, pp. 85-92.

Zokaee et al., "Mitigating Voltage Drop in Resistive Memories by Dynamic RESET Voltage Regulation and Partition RESET", 2020 IEEE International Symposium on High Performance Computer Architecture (HPCA), San Diego, CA, USA, 2020, pp. 275-286.

* cited by examiner

DISTRIBUTED WRITE DRIVER FOR MEMORY ARRAY

CROSS-REFERENCE TO RELATED APPLICATIONS

This application claims foreign priority to European Application No. 22208717.3, filed Nov. 22, 2022, which is incorporated by reference herein in its entirety.

BACKGROUND

Field

The disclosed technology relates generally to memory devices, and more particularly to write drivers for memory devices.

Description of the Related Technology

A memory device can include a plurality of memory lines. The memory lines can include a plurality of bit lines and a plurality of word lines. The memory device further includes a plurality of memory cells, which are connected to the bit lines and the word lines, respectively. For example, multiple memory cells are connected to each bit line, multiple memory cells are connected to each word line, and each memory cell is connected to one of the bit lines and one of the word lines.

In order to write information into a memory cell, the memory cell is typically first activated by sending a current on the word line to which it is connected, which causes an activation voltage to be applied to the memory cell. Then, the information is caused to be stored in the activated memory cell, e.g., by sending a current on the bit line to which it is connected, which causes a write voltage to be applied to the memory cell. To this end, write drivers may be respectively connected to an end of the bit line and to an end of the word line. The write drivers are also configured to provide the respective voltages and/or currents on the word line and bit line.

SUMMARY OF CERTAIN INVENTIVE ASPECTS

In view of the above, an objective of the disclosed technology is to provide an improved write driver for a memory device, e.g., a crossbar memory device, and a method for operating the write driver. An objective is thereby to mitigate the problems arising from the parasitic resistances of the memory lines of the memory device. For instance, an objective is to avoid a to high supply voltage of the write driver, in order to avoid any half-biasing of memory cells during a write operation.

These and other objectives are achieved by the solutions of disclosed technology described in the independent claims. Advantageous implementations are described in the dependent claims.

A first aspect of the disclosed technology is a method for operating a write driver for a memory device. The write driver is connected to a memory line of the memory device, and multiple memory cells of the memory device are connected to the memory line at different distances from the write driver. The method includes: controlling the write driver to provide a smaller amount of current for accessing a first memory cell of the memory cells; and controlling the write driver to provide a larger amount of current for accessing a second memory cell of the memory cells. The first memory cell is connected to the memory line at a smaller distance to the write driver than the second memory cell.

By providing the smaller amount of current when accessing the first (near) memory cell, and the larger amount of current when accessing the second (far) memory cell, both the first memory cell and the second memory cell may be properly accessed. Accessing the memory cell may include activating the memory cell or writing into the memory cell. Although, these memory cells have different distances to the write driver, and even if the memory line has a non-negligible parasitic resistance, an increase of the supply voltage of the write driver is not required in the disclosed technology. Thus, unintended half-biasing of nearer memory cells can be prevented, when writing into the first or second memory cell.

The write driver may provide a comparatively smaller amount of current for a memory cell arranged closer to the write driver, and a comparatively larger amount of current for a memory cell arranged farther away from the write driver, where the parasitic resistance of the memory line can be accounted for.

In some implementations of the method, the write driver can include a plurality of transistors, and the method can also include: controlling the write driver to activate a first set of the transistors for accessing the first memory cell; and controlling the write driver to activate a second set of the transistors for writing into the second memory cell. The first set of the transistors can include fewer transistors than the second set of the transistors.

Activating fewer transistors may lead to the smaller amount of current, and activating more transistors may lead to the larger amount of current, where, for example, all the transistors have the same or similar size.

In some implementations of the method, the write driver can include a plurality of transistors with different transistor widths, and the method further comprises: controlling the write driver to activate a first set of the transistors for accessing the first memory cell; and controlling the write driver to activate a second set of the transistors for accessing the second memory cell. A sum of all transistor widths of one or more transistors that form the first set of the transistors can be smaller than a sum of all transistor widths of one or more transistors that form the second set of the transistors.

Since the current provided by a transistor may scale proportionally with the width of the transistor, a smaller sum of transistor width may lead to the smaller amount of current, and a larger sum of transistor width may lead to the larger amount of current.

In some implementations of the method, each transistor width of the plurality of transistors can be an integer multiple of a base transistor width.

In some implementations of the method, the first memory cell can be included in a first set of the memory cells and the second memory cell can be included in a second set of the memory cells, and the method can further comprises: controlling the write driver to activate the first set of the transistors for accessing any memory cell of the first set of the memory cells; and controlling the write driver to activate the second set of the transistors for accessing any memory cell of the second set of the memory cells.

This method can simplify the operation of the write driver and the memory device, respectively. The transistor activation may not have to be adjusted for each memory cell, but the adjustment can be made set-wise for sets of memory cells.

In some implementations of the method, the method can further comprise: controlling the write driver to provide a shorter voltage pulse to the memory line for accessing the first memory cell; and controlling the write driver to provide a longer voltage pulse to the memory line for accessing the second memory cell.

The shorter voltage pulse for accessing the first memory cell can lead to a shorter current pulse, such that the current pulse duration is different than for accessing the second memory cell. Due to the parasitic drop over the memory line, the amount of current at the second memory cell would be less than the amount of current at the first memory cell, if the same pulse duration were applied. Therefore, the longer current pulse is applied for accessing the second memory cell.

In some implementations of the method, the first memory cell can be included in a first set of the memory cells and the second memory cell can be included in a second set of the memory cells, and the method can further comprise: controlling the write driver to provide a shorter voltage pulse to the memory line for accessing any memory cell of the first set of the memory cells; and controlling the write driver to provide a longer voltage pulse to the memory line for accessing any memory cell of the second set of the memory cells.

This method can simplify the operation of the write driver and the memory device, respectively. The voltage pulse of the write driver does not have to be adjusted for each memory cell, but the adjustment can be made set-wise for sets of memory cells.

In some implementations of the method, a pulse width of the voltage pulse provided to the memory line can be controlled using a configurable delay.

In some implementations of the method, the memory line can be a bit line of the memory device, and accessing the first memory cell or the second memory cell can include writing into the first memory cell or the second memory cell, respectively; or the memory line is a word line of the memory device, and accessing the first memory cell or the second memory cell comprises activating the first memory cell or the second memory cell, respectively.

In some implementations of the method, the memory cells of the memory device can be voltage-controlled magnetic anisotropy (VCMA) memory cells, or phase change memory (PCM) cells, spin-orbit torque (SOT) memory cells, or spin-transfer torque (STT) memory cells.

Notably, the memory device can be any crossbar memory device. For instance, it can be a VCMA memory device, PCM memory device, SOT memory device, or STT memory device.

A second aspect of the disclosed technology is a write driver for a memory device that the write driver is connectable to an end of a memory line of the memory device, where multiple memory cells of the memory device are connected to the memory line at different distances from the end of the memory line, and the write driver includes a controller configured to: control the write driver to provide a smaller amount of current for accessing a first memory cell of the memory cells; and control the write driver to provide a larger amount of current for accessing a second memory cell of the memory cells. The first memory cell is connected to the memory line at a smaller distance to the end of the memory line than the second memory cell.

In some implementations of the write driver, the write driver can include a plurality of transistors, and the controller can be configured to control each one the transistors with an individual control signal.

Thus, sets of transistors can be activated independently from other sets of transistors.

In some implementations of the write driver, the write driver can include one or more transistors having a first transistor width and one or more transistors having a second transistor width.

Thus, different transistors may provide different amounts of current, which allows the overall amount of current output by the write driver to be adjusted.

In some implementations of the write driver, the controller can be configured to: control the write driver to output a shorter voltage pulse, which results in a shorter current duration, for providing the smaller amount of current; and control the write driver to output a longer voltage pulse, which results in a longer current duration, for providing the larger amount of current.

The write driver of the second aspect achieves the same advantages as described for the method of the first aspect and its implementations. In particular, the write driver of the second aspect may be configured to perform the method of the first aspect and any of its implementations.

The write driver of the second aspect can be controlled such that the parasitic resistance of the memory line is taken into account.

A third aspect of disclosed technology is a memory device that includes: a plurality of bit lines and a plurality of word lines; a plurality of write drivers, wherein each write driver is connected to an end of one of the bit line or an end of one of the word lines; and a plurality of memory cells, wherein multiple memory cells are connected to each of the bit lines and to each of the word lines, respectively, at different distances from the write driver connected to that bit line or word line. One or more or all of the write drivers are according to the second aspect or any implementation thereof.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Memory arrays Include memory lines. The memory lines include a plurality of bit lines and a plurality of word lines. The memory device further includes a plurality of memory cells, which are connected to the bit lines and the word lines, respectively. For example, multiple memory cells are connected to each bit line, multiple memory cells are connected to each word line, and each memory cell is connected to one of the bit lines and one of the word lines.

In some memory applications, writing information into the memory cell implies the current flowing from the write driver through the memory cell, where the write voltage drops at the memory cell. However, each memory line of the memory device may have a non-negligible parasitic resistance. This parasitic resistance can lead to differences in writing information (e.g., different voltage drops) to different memory cells of the same bit line, due to their different distances from the write driver.

For instance, writing information into a near memory cell (arranged closer to the write driver) may differ from writing information into a far memory cell (arranged further away from the write driver). For example, for a certain current that is output by the write driver on the bit line for writing information, a write voltage that is applied to the far memory cell may be smaller than a write voltage that is applied to the near memory cell, due to the parasitic resistance of the bit line that is larger for the far memory cell. This can lead a scenario in which the write voltage at the far memory cell may be too small to properly write the information.

To resolve this deficiency, in some technologies, the current provided by the write driver could be simply set to a high enough value, which enables a proper writing of the information also into the far memory cell. However, the high current value may involve an unwanted increase of the supply voltage of the write driver. Furthermore, the high supply voltage may lead to unintended half-biasing of a non-activated near memory cell, when information is written to the far memory cell. Another potential issue is a write disturbance.

To address these and other issues, the disclosed technology relates to a write driver for a memory device and a method for operating the write driver. The write driver may be connected to a memory line of the memory device. The write driver can be used to write into a memory cell or to activate a memory cell of the memory device. The write driver can also be adapted and operated in view of a parasitic resistance of the memory line.

Figure 1:
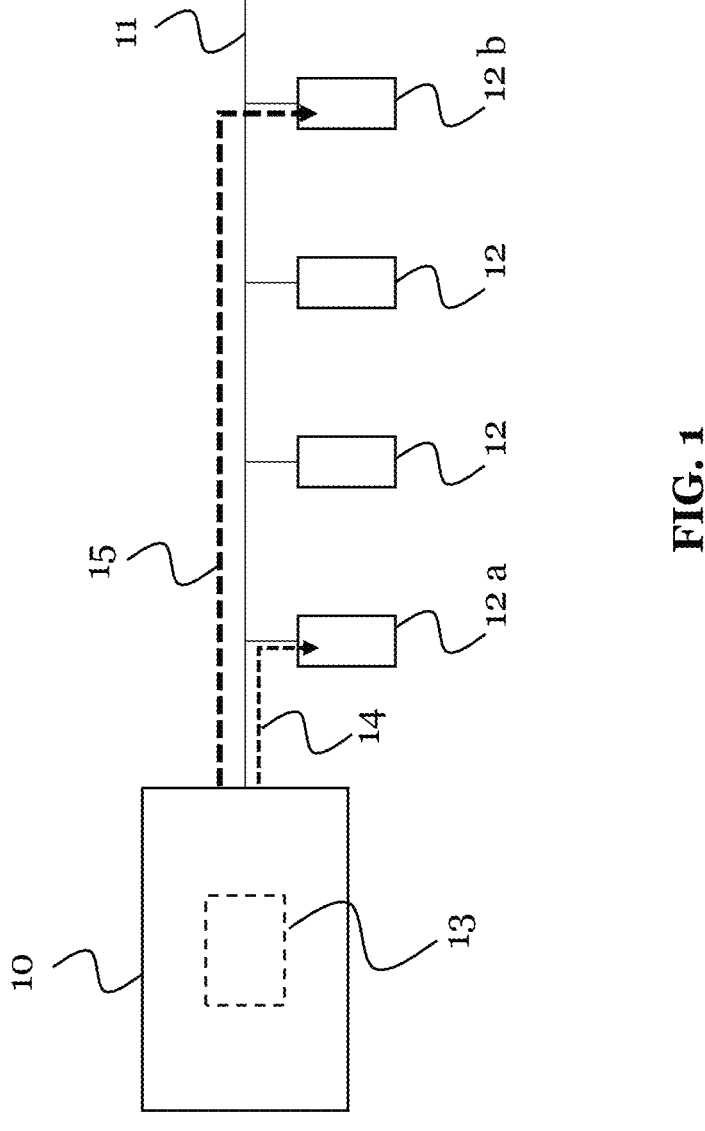
FIG. 1 shows a write driver according to disclosed technology.

FIG. 1 shows a write driver 10 according to one or more embodiments of the disclosed technology. The write driver 10 can be used in a memory device, such as a crossbar memory device. The write driver 10 can be connected to an end of a memory line 11 of the memory device, as shown in FIG. 1. The memory line 11 may be a bit line or a word line of the memory device.

Multiple memory cells 12 of the memory device can be connected to the memory line 11, such as along the memory line 11, as shown in FIG. 1. Thus, the write driver 10 can be connectable with the memory cells 12 at different distances for each memory cell 12. For example, if the write driver 10 is connected to the end of the memory line 11, the memory cells 12 are accordingly arranged with different distances between each memory cell to the write driver 10. The memory cells 12 may be voltage-controlled magnetic anisotropy (VCMA) memory cells, phase change memory (PCM) cells, or spin transfer torque (STT) memory cells. The disclosed technology is not limited to these types of memory cells, and the types of memory cells can be other known types of memory cells.

The write driver 10 can further include a controller 13. In some embodiments, the controller 13 can be included (or integrated) in the write driver 10 (e.g., write driver circuitry), as shown in FIG. 1, or may be implemented as a separate control circuitry. In some embodiments, the controller 13 may also be implemented as a part of a controller of the memory device or may be implemented by the controller of the memory device. Thus, the controller 13 may control the write driver 10 and also other write drivers implemented in the memory device.

The controller 13 may include processing circuitry (not shown) configured to perform, conduct or initiate the various operations of the controller 13 described herein. The processing circuitry may include hardware, and/or the processing circuitry may be controlled by software. The hardware may include analog circuitry or digital circuitry, or both analog and digital circuitries. The digital circuitry may include components, such as application-specific integrated circuits (ASICs), field-programmable arrays (FPGAs), digital signal processors (DSPs), or multi-purpose processors. The controller 13 may further include memory circuitry, which stores one or more instruction(s) that can be executed by the processor or by the processing circuitry, for example, executed by the software command instruction.

In some embodiments, the controller 13 can be configured to control the write driver 10 to provide a smaller amount of current 14 for accessing a first memory cell 12a of the memory cells 12 connected to the memory line 11. The controller 13 can also provide a larger amount of current 15 for accessing a second memory cell 12b of the memory cells 12 connected to the memory line 11. The first memory cell 12a is thereby connected to the memory line 11 at a smaller (e.g., closer) distance to the end of the memory line 11 (and thus the write driver 10) than the second memory cell 12b. In some embodiments, the first memory cell 12a may be referred to as a near memory cell, and the second memory cell 12b may be referred to as a far memory cell (comparatively) with respect to the write driver 10. Notably, accessing any memory cell 12 may include activating the memory cell 12 or writing information into the memory cell 12.

In some embodiments, selecting the amount of current, such as currents 14, 15 which may depend on the position of the memory cells, 12a, 12b, with respect to the write driver 10 may eliminate the effects of the parasitic resistance of the memory line 11. For example, the path for the current into or through the first memory cell 12a may experience less parasitic resistance effect of the memory line 11 than the path for the current into or through the second memory cell 12b. The write voltage, which is applied to a memory cell 12 of the memory line 11, when providing the respective amount of current 14, 15, can be high enough in each case to ensure a proper access to the memory cell 12.

Figure 2:
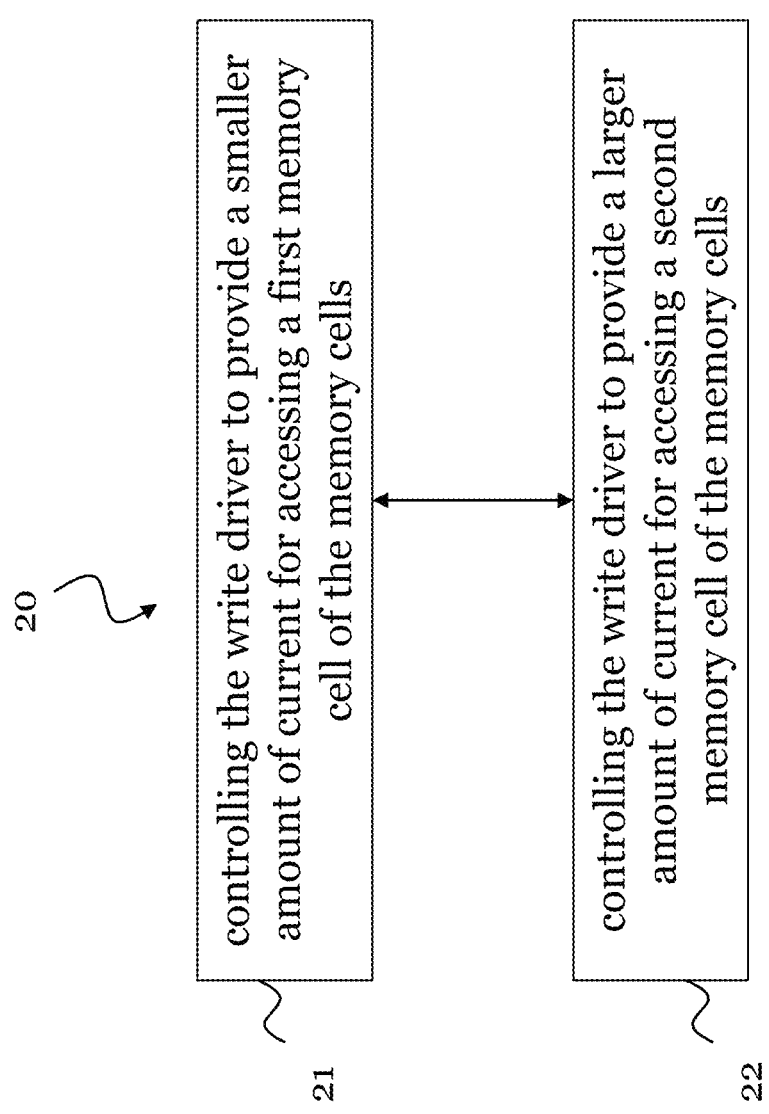
FIG. 2 shows a method for operating a write driver according to disclosed technology.

FIG. 2 shows a flow diagram of a method 20 according to disclosed technology. The method 20 can be used to operate a write driver 10 of a memory device. For example, the method 20 may operate the write driver 10 of FIG. 1. Thus, the controller 13 of FIG. 1 may be configured to perform the method 20.

Accordingly, in-line with the above description of the write driver 10 of FIG. 1, the method 20 can include a step 21 of controlling the write driver 10 to provide the smaller amount of current 14 for accessing the first memory cell 12a. The method 20 can also include a step 22 of controlling the write driver 10 to provide the larger amount of current 15 for accessing the second memory cell 12b. Notably, the method 20 may include these steps in any order, and either step may be repeated one or more times based on specific applications.

In some embodiments, the write driver 10 can provide the different amounts of current 14, 15 by individually controlling transistors (e.g., different transistors) of the write driver 10 based on whether the first memory cell 12a or the second memory cell 12b is to be accessed. In some embodiments, controlling the transistors of the write driver 10 can be based on a position of a memory cell 12 along the memory line 11.

Figure 3:
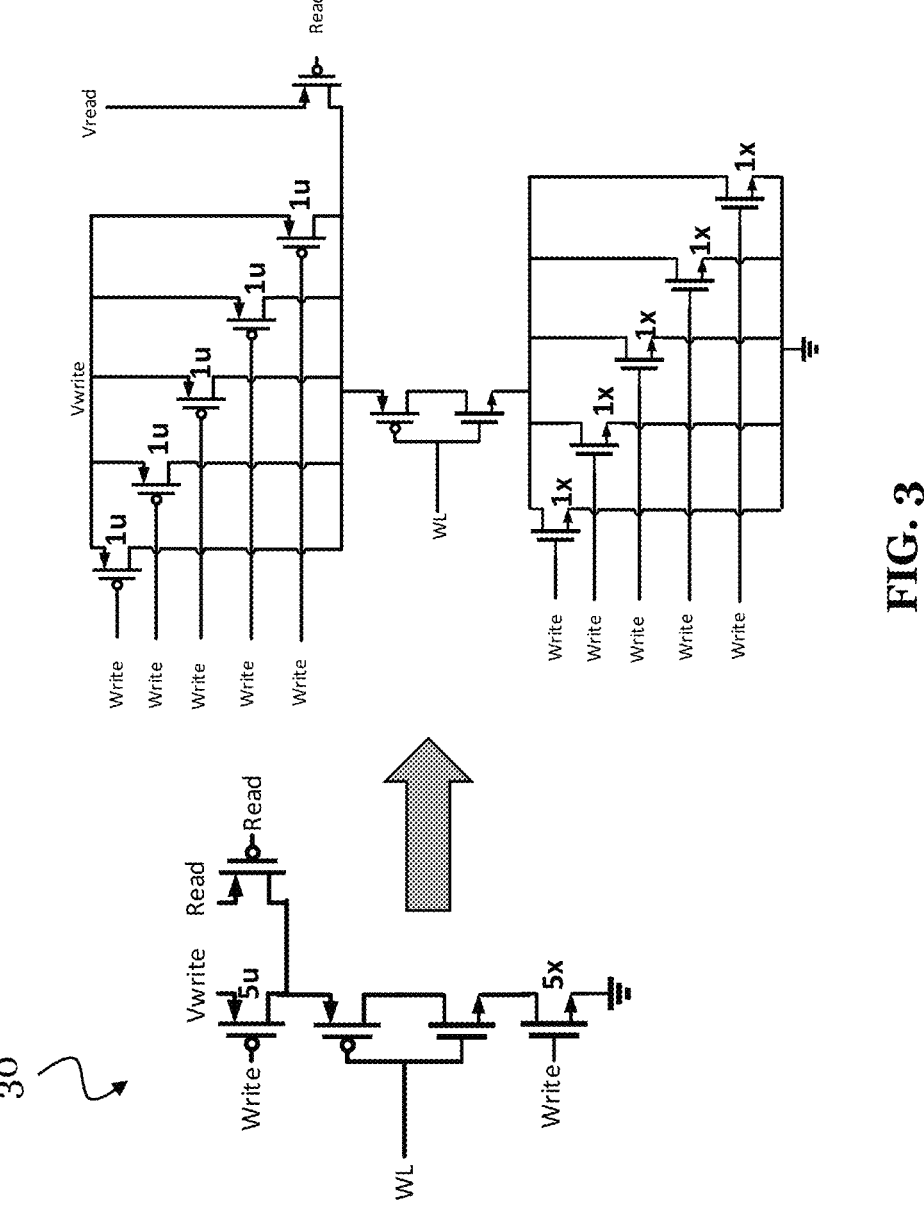
FIG. 3 shows an exemplary write driver according to disclosed technology.

FIG. 3 shows an exemplary write driver 30. The write driver 30 can include a plurality of transistors, each having a base transistor width of 1 u (e.g., 1 µm). The write driver 30 can be configured to apply a common write signal, Write, to the transistors that outputs the write voltage (e.g., transistors that receive the Write in FIG. 3) in order to activate the transistors to output a determined amount of write current.

Figures 4A, 4B:
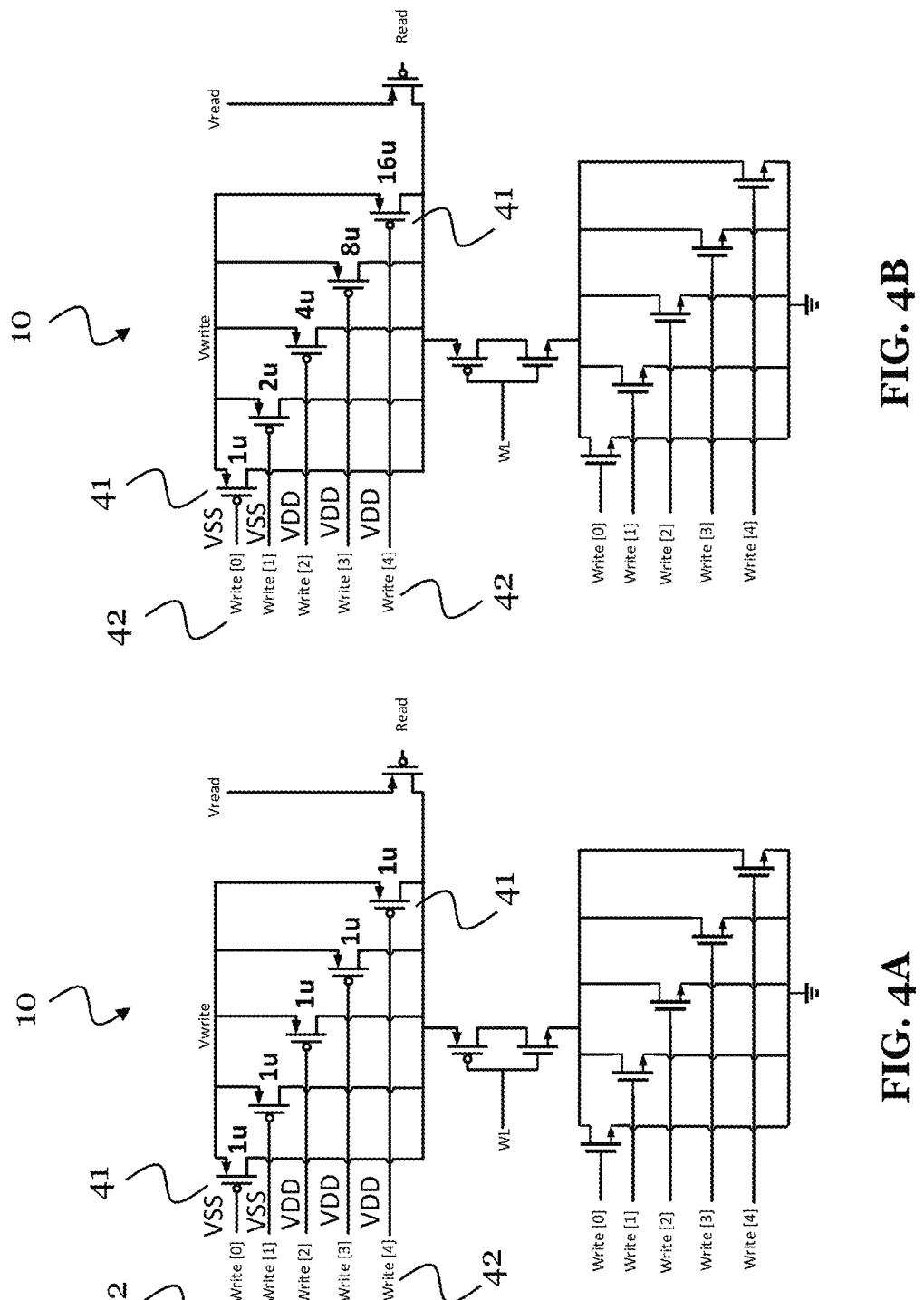
FIGS. 4A and 4B show examples of a write driver according to disclosed technology.

FIG. 4A shows another exemplary embodiments of a write driver 10 according to disclosed technology. The write driver 10 also include a plurality of transistors 41. The transistors 41 also have each a base transistor width of 1 u (e.g., 1 µm). In contrast to the write driver 30 of FIG. 3, the write driver 10 of FIG. 4A can be configured to control each one the transistors 41 with an individual control signal 42. The individual control signal 42 can referred to as individual write signal.

By making use of the individual control signals 42, the controller 13 can be configured to activate each transistor 41 individually, and to activate different sets of the transistors 41 at different times. For instance, the controller 13 may be configured to control the write driver 10 to activate a first set of the transistors 41 for accessing the first memory cell 12a and/or to activate a second set of the transistors 41 for accessing the second memory cell 12b. Thereby, each set of transistors may include one or more of the transistors 41, and one or more transistors 41 may be included in more than one set of transistors. The first set of the transistors 41 for accessing the first memory cell 12a may include fewer number of transistors 41 than the number of second set of the transistors 41 for accessing the second memory cell 12b. Accordingly, given that, in some examples, all transistors 41 may have the same or similar transistor width, the smaller amount of current 14 is provided by activating the first set of the transistors 41, and the larger amount of current 15 is provided by activating the second set of the transistors 41.

In some embodiments, multiple sets of transistors 41 can be formed (e.g., grouped) depending on the number of the plurality of transistors 41. For each memory cell 12 along the memory line 11 (shown in FIG. 1), a different set of transistors 41 may be used for accessing each memory cell 12. However, it is usually more pragmatic to associate one set of the transistors 41 with one set or group of the memory cells 12. For example, the first memory cell 12a may be included in a first set of the memory cells 12, and the second memory cell 12b may be included in a second set of the memory cells 12. In this case, the first set of the transistors 41 may be activated for accessing memory cell, including 12a, of the first set of the memory cells 12, and the second set of the transistors 41 may be activated for accessing any memory cell, including 12b, of the second set of the memory cells 12.

In some examples with a write driver 10 having five transistors (as shown in FIG. 4A), and a memory line 11 with 512 memory cells 12, the following table shows an example of operating the transistors 41 of the write driver 10.

| # 1-100 | 1 T is on |
|---|---|
| # 101-200 | 2 Ts are ON |
| # 201-300 | 3 Ts are On |
| # 301-400 | 4 Ts are ON |
| # 401-512 | 5 Ts are On |

The memory cells 12 may be numbered from 1 to 512, starting from the write driver 10, such that the memory cell #1 is located the closest to the write driver 10, and the memory cell #512 is located farthest away from the write driver 10. For any one of the first one hundred memory cells 12 (#1-#100), only one transistor 41 (1T) is activated (ON). For any one of the second one hundred memory cells 12 (#101-#200), two transistors 41 (2 Ts) are activated. For any one of the third one hundred memory cells 12 (#201-#300), three transistors 41 (3 Ts) are activated. For any one of the fourth one hundred memory cells 12 (#301-#400), four transistors 41 (4 Ts) are activated. For any one of the remaining memory cells 12 (#401-#512), all five transistors 41 (5 Ts) are activated.

FIG. 4B shows another example of a write driver 10 according to disclosed technology, which can include a plurality of transistors 41 with different transistor widths, in contrast to the write driver 30 of FIG. 3 and the write driver 10 of FIG. 4A. The write driver 10 may include one or more transistors 41 having a first transistor width, and one or more transistors 41 having a second transistor width. Each transistor width of the plurality of transistors 41 may be an integer multiple of a base transistor width 1 u (e.g., 1 µm). As an example, the write driver 10 of FIG. 4B may have five transistors 41 with respectively transistor width of 1 u, 2 u, 4 u, 8 u, and 16 u.

In some cases, the controller 13 may be configured to control the write driver 10 to activate a first set of the transistors 41 for accessing the first memory cell 12a, and a second set of the transistors 41 for accessing the second memory cell 12b. In some embodiments, the sum of all the transistor widths of the transistors 41 of the first set is smaller than a sum of all the transistor widths of the transistors 41 of the second set. For instance, the first set of transistors may include three transistors 41 with transistor width 1 u, 2 u and 8 u, such that the sum of widths is 11 u, while the second set of transistors can include two transistors with transistor width of 4 u and 16 u, such that, the sum of widths is 20 u. Accordingly, the smaller amount of current 14 (shown in FIG. 1) can be provided by activating transistors 41 with a lower sum of their transistor widths (activating the first set of transistors), and the larger amount of current 15 is provided by activating transistors 41 with a larger sum of their transistor widths (activating the second set of transistors).

In some embodiments, the transistors 41 can be formed into multiple sets of transistors. These multiple sets can be formed depending on the number of the plurality of transistors 41. For each memory cell 12 along the memory line 11 (shown in FIG. 1), a different set of transistors 41 may be formed with a different sum of transistors width. However, it is more pragmatic to associate one set of the transistors 41 with one set or group of the memory cells 12. For example, with reference to FIG. 1, the first memory cell 12a may be included in a first set of the memory cells 12, and the second memory cell 12b may be included in a second set of the memory cells 12. In this case, the first set of the transistors 41 may be activated for accessing any memory cell(s) of the first set of the memory cells 12, and the second set of the transistors 41 may be activated for accessing any memory cell(s) of the second set of the memory cells 12.

Following the above example of 512 memory cells 12 on a memory line 11, if each transistor 41 would individually define one set of transistors 41, such that if, for each set of the memory cells 12a, different transistor 41 would be turned on, and this would result in the following table.

| # 1-100 | 1 u |
|---|---|
| # 101-200 | 2 u |
| # 201-300 | 4 u |
| # 301-400 | 8 u |
| # 401-512 | 16 u |

The write drivers 10 of FIG. 4A and FIG. 4B can be configurable write drivers 10 according to disclosed technology. This means that the amount of current that they can output is configurable. For example, the current output can be controlled by the controller 13 according to the required current. The required current can be determined based on the particular memory cell 12 to be accessed and its distance from the write driver 10. Also, the required current can be depending on the parasitic resistance of memory line 11. Different memory lines 11 and/or different length of memory line 11 could have different parasitic resistances.

The write driver 10 of FIG. 4A and the write driver 30 of FIG. 3 may have the same area. In some examples, the write driver 10 of FIG. 4B may be marginally larger, due to the varying transistor widths. A number of signal lines to provide the control signals 42 may be higher for the write driver 10 of FIG. 4A and FIG. 4B, than for the write driver 30 of FIG. 3. In some examples, the signal lines of the write driver 10 of FIG. 4A/FIG. 4B and the write driver 30 of FIG. 3 can be fit into the same area.

Figure 5:
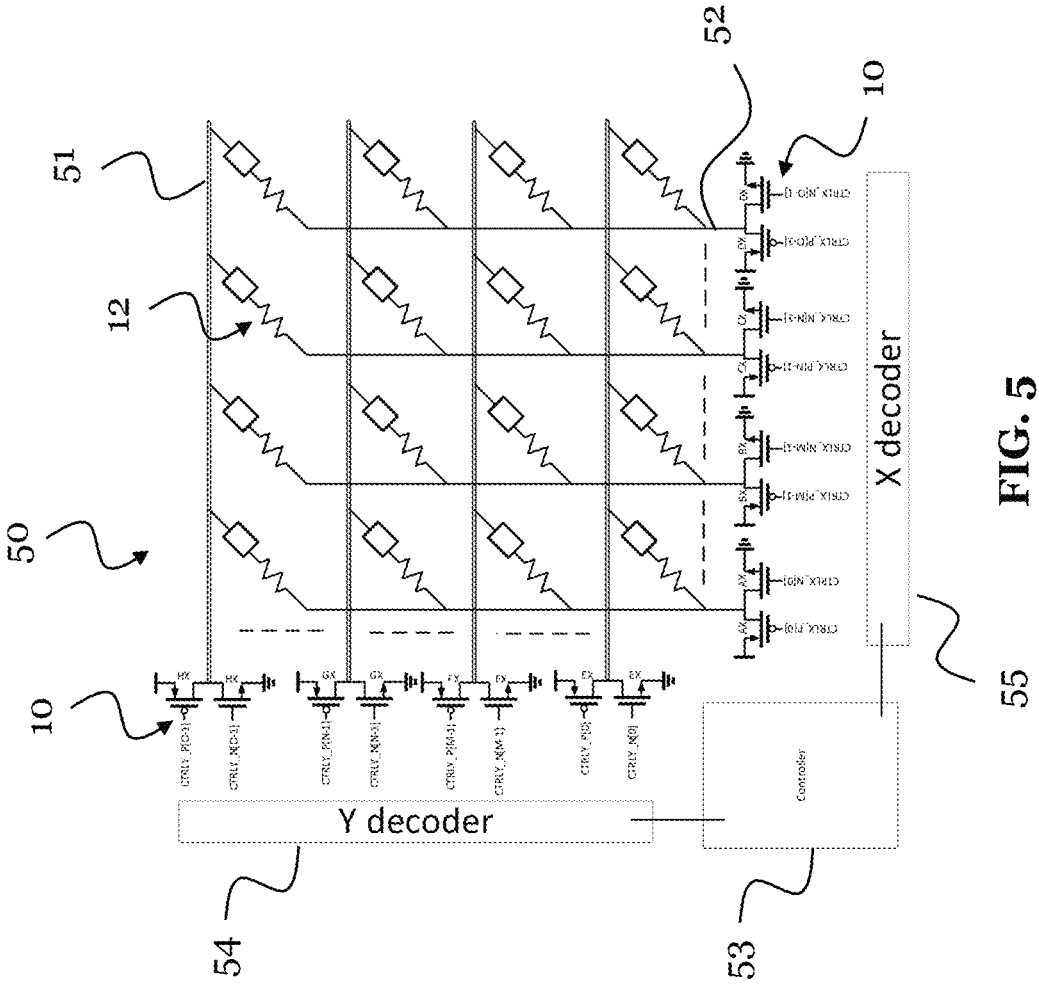
FIG. 5 shows an example of a memory device according to disclosed technology.

FIG. 5 shows an example of a memory device 50 according to disclosed technology, for which the write drivers 10 according to disclosed technology are applicable. The memory device 50 of FIG. 5 is a crossbar memory device.

The memory device 50 can include a plurality of bit lines 51 and a plurality of word lines 52, and a plurality of write drivers 10, each write driver being connected to an end of one of the bit lines 51 or an end of one of the word lines 52. The multiple memory cells 12 of each memory line 11 (bit line 51 or word line 52) can be connected at different distances from the respective write driver 10. In the memory device 50 according to disclosed technology, one or more or all of the write drivers may be write drivers 10 according to disclosed technology.

In some example scenarios, if the write driver 10 is connected to a bit line 51, accessing a memory cell 12 of the bit line 51 can include writing into the memory cell 12. If the write driver 10 is connected to a word line 52, accessing the memory cell 12 of the word line 52 can include activating the memory cell 12.

The memory device 50 may further include a memory controller 53, a Y decoder 54 (row decoder), and an X decoder 55 (column decoder). The memory controller 53 may form the controller 13 for controlling each of the write drivers 10, optionally together with the Y decoder 54 and/or the X decoder 55.

Another way to provide the different amounts of current 14, 15 (shown in FIG. 1) by the write driver 10 is to control the write driver 10 to provide voltage pulses with different duration for each voltage pulse. That is, the voltage pulses with small duration may be provided for generating smaller amounts of current and vice versa.

Figure 6:
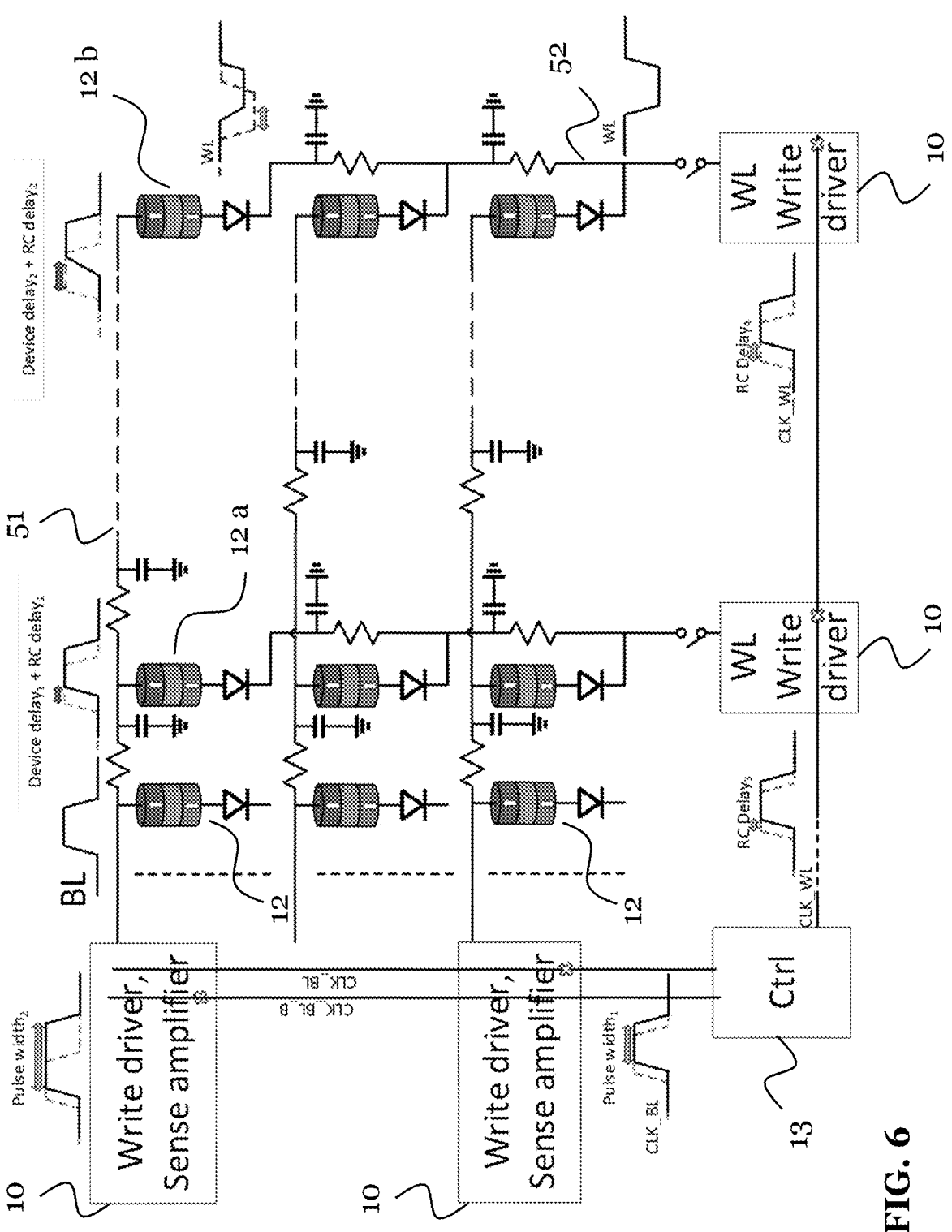
FIG. 6 shows an example of operating a write driver according to disclosed technology.

FIG. 6 shows in this respect an example of operating a write driver 10 according to disclosed technology in a crossbar memory device 50. In this example, the write driver 10 is collocated with a sense amplifier.

The controller 13 may be configured to control the write driver 10 to provide a shorter voltage pulse to the memory line 11 when accessing the first memory cell 12a, and a longer voltage pulse when accessing the second memory cell

12b. In the example of FIG. 6, the memory line 11 is a bit line 51. For example, similar to above embodiments, the first memory cell 12a may be included in a first set of the memory cells 12, and the second memory cell 12b may be included in a second set of the memory cells 12. In this example, the write driver 10 may provide the shorter voltage pulse for accessing any memory cell 12, including 12a, of the first set of the memory cells 12, and may provide the longer voltage pulse for accessing any memory cell 12, including 12b, of the second set of the memory cells 12.

For a comparatively far memory cell, such as the second memory cell 12b, as shown in FIG. 6, a voltage across the memory cell (e.g., a VCMA memory cell) may be reduced, due to the larger voltage drop on the parasitic resistance of the memory line 11. As a result, more time may be required to write into the memory cell 12. The required pulse width may thus be increased for the far memory cell 12b, such that the longer pulse width may be provided. The controller 13 may be configured to control the write driver 10 to provide at least two different pulse widths, for example, for near memory cells 12 and far memory cells 12, respectively.

Figure 7:
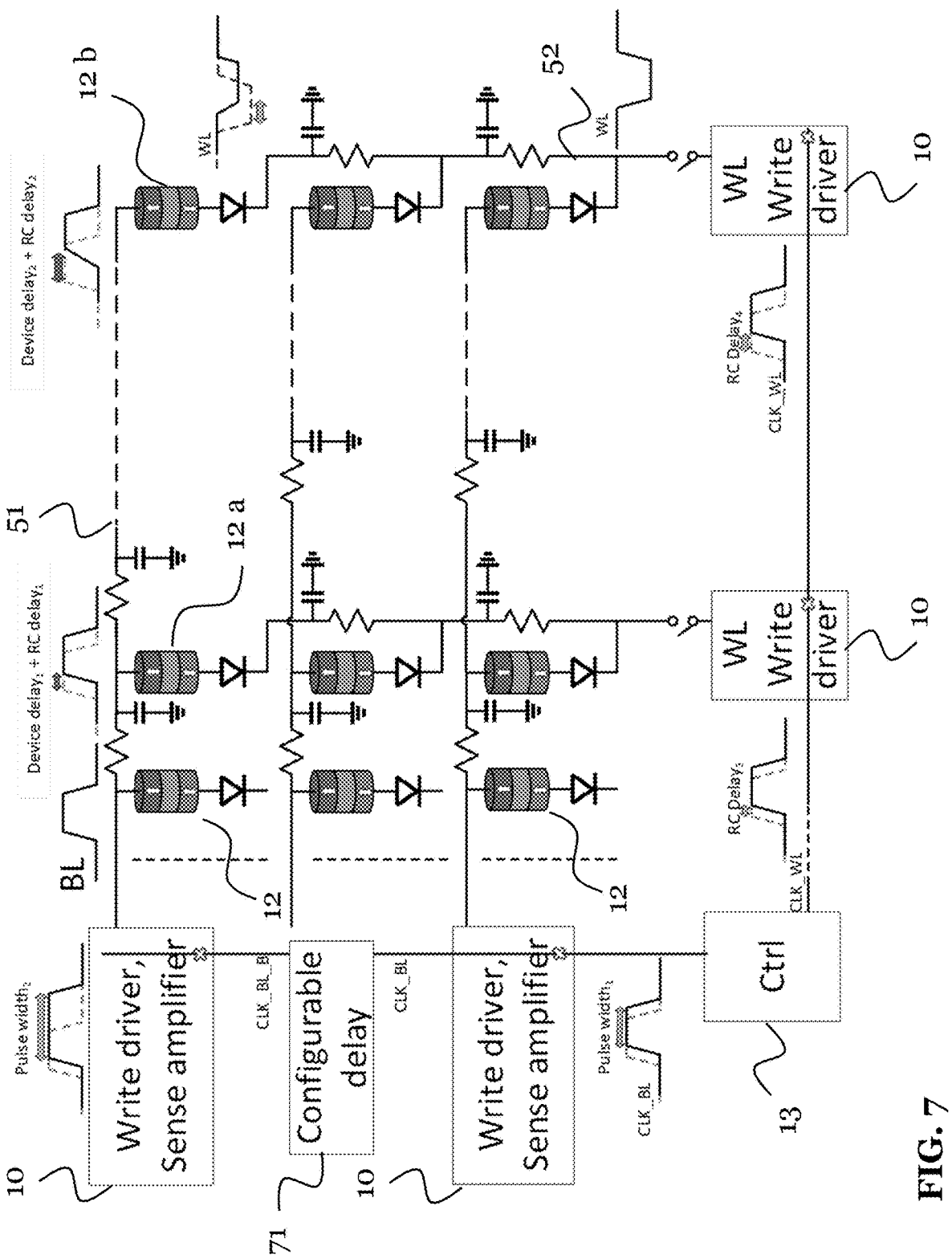
FIG. 7 shows an example of operating a write driver according to disclosed technology.

FIG. 7 shows that the memory device 50 may include a configurable delay 71. A pulse width of the voltage pulse provided by the write driver 10 to the memory line 11 may be controlled using the configurable delay 71. For instance, the controller 13 may be configured to control the configurable delay 71. The configurable delay 71 may help in increasing the required pulse width.

In the following, some results for a specific example of a memory device 50 are described with respect to FIGS. 8A-8D. In the example, the memory device 50 can include 32 memory cells 12, which are divided into four groups, such that each group has 8 memory cells 12, and each group is connected to one bit line 51 (BL0, BL1, BL2, BL3).

Figures 8A, 8B, 8C, 8D:
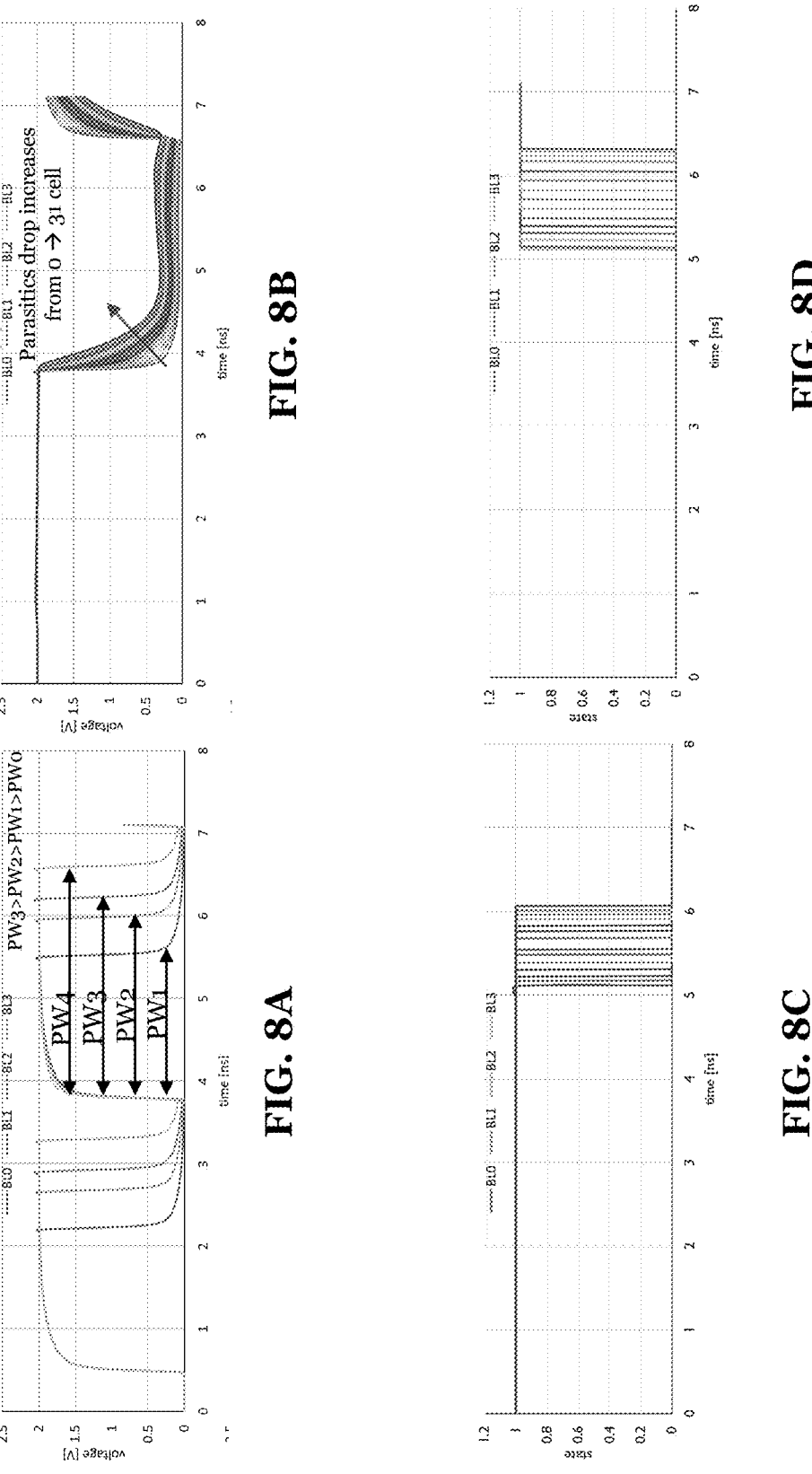
FIGS. 8A-8D show example results of operating a memory device according to disclosed technology.

As shown in FIG. 8A, four different pulses (with different pulse width PW1, PW2, PW3, PW4) are generated by the write drivers 10, which are connected to these bit lines 51, under control from the controller 13, in order to cater all four groups of memory cells 12, and in order to mitigate different parasitic resistances of the four bit lines 51.

As shown in FIG. 8B, a parasitics drop increases from the first memory cell 12 (cell #0) to the last memory cell 12 (cell #31). As shown in FIG. 8C, the resistance state of 16 memory cells 12 changes from a high resistance to a low resistance, and as shown in FIG. 8D, the resistance state of 16 memory cells 12 changes from a low resistance to a high resistance. All 32 cells are switched.

In summary, the write drivers 10 of disclosed technology, and the method 20 for operating the write driver 10, can provide significant advantages in a memory device 50 with memory lines 11 having non-negligible parasitic resistances. The number of transistors and width of transistors disclosed herein are merely provided as examples, and the disclosed technology is not limited to these number of transistors and the width of these transistors.

In the claims as well as in the description of disclosed technology, the word "comprising" does not exclude other elements or steps and the indefinite article "a" or "an" does not exclude a plurality. A single element may fulfill the functions of several entities or items recited in the claims. The mere fact that certain measures are recited in the mutual different dependent claims does not indicate that a combination of these measures cannot be used in an advantageous implementation.

What is claimed is:

1. A method of operating a write driver for a memory device, the method comprising:

providing the memory device comprising the write driver connected to a memory line of the memory device, wherein multiple memory cells of the memory device are connected to the memory line at different distances from the write driver, and wherein the write driver comprises a plurality of transistors;

controlling the write driver to activate a first set of the transistors for accessing a first memory cell of the memory cells;

controlling the write driver to activate a second set of the transistors for accessing a second memory cell of the memory cells;

controlling the write driver to provide a smaller amount of current for accessing the first memory cell; and controlling the write driver to provide a larger amount of current for accessing the second memory cell;

wherein the first memory cell is connected to the memory line at a smaller distance to the write driver along the memory line than the second memory cell, and wherein:

the first set of the transistors includes fewer transistors than the second set of the transistors, or the plurality of transistors have different transistor widths and a sum of widths of one or more transistors included in the first set of the transistors is smaller than a sum of widths of one or more transistors included in the second set of the transistors.

2. The method according to claim 1, wherein each transistor width of the plurality of transistors is an integer multiple of a base transistor width.

3. The method according to claim 1, wherein the first memory cell is included in a first set of the memory cells and the second memory cell is included in a second set of the memory cells, and wherein the method further comprises:

controlling the write driver to activate the first set of the transistors for accessing a memory cell of the first set of the memory cells; and controlling the write driver to activate the second set of the transistors for accessing a memory cell of the second set of the memory cells.

4. The method according to claim 1, wherein the method further comprises:

controlling the write driver to provide a shorter voltage pulse to the memory line for accessing the first memory cell; and controlling the write driver to provide a longer voltage pulse to the memory line for accessing the second memory cell.

5. The method according to claim 4, wherein the first memory cell is included in a first set of the memory cells and the second memory cell is included in a second set of the memory cells, and wherein the method further comprises:

controlling the write driver to provide a shorter voltage pulse to the memory line for accessing a memory cell of the first set of the memory cells; and controlling the write driver to provide a longer voltage pulse longer than the shorter voltage pulse to the memory line for accessing a memory cell of the second set of the memory cells.

6. The method according to claim 5, wherein a pulse width of the shorter voltage pulse or the longer voltage pulse provided to the memory line is controlled using a configurable delay.

7. The method according to claim 1, wherein:

the memory line is a bit line of the memory device, and accessing the first memory cell or the second memory cell comprises writing into the first memory cell or the second memory cell, respectively.

8. The method according to claim 1, wherein:

the memory line is a word line of the memory device, and accessing the first memory cell or the second memory cell comprises activating the first memory cell or the second memory cell, respectively.

9. The method according to claim 1, wherein the memory cells of the memory device comprise voltage-controlled magnetic anisotropy memory cells, phase change memory cells, spin-orbit torques memory cells, or spin-transfer torque memory cells.

10. A write driver for a memory device, wherein the write driver is connectable to an end of a memory line of the memory device, wherein multiple memory cells of the memory device are connected to the memory line at different distances from the end of the memory line, and wherein the write driver comprises a plurality of transistors and a controller configured to:

control the write driver to provide a smaller amount of current for accessing a first memory cell of the memory cells;

control the write driver to provide a larger amount of current larger than the smaller amount for accessing a second memory cell of the memory cells, wherein the first memory cell is connected to the memory line at a smaller distance to the end of the memory line along the memory line than the second memory cell, and control each one of the plurality of transistors with an individual control signal.

11. The write driver according to claim 10, wherein the plurality of the transistors comprises one or more transistors having a first transistor width and one or more transistors having a second transistor width.

12. The write driver according to claim 10, wherein the controller is configured to:

control the write driver to output a shorter voltage pulse, which results in a shorter current duration, for providing the smaller amount of current; and control the write driver to output a longer voltage pulse, which results in a longer current duration, for providing the larger amount of current.

13. A memory device comprising:

a plurality of bit lines and a plurality of word lines;

a plurality of write drivers each connected to an end of one of the bit lines or an end of one of the word lines; and a plurality of memory cells, wherein each of the bit lines and the word lines has connected thereto multiple ones of the memory cells at different distances from the end of the each of the bit lines and the word lines, wherein each of the write drivers comprises a plurality of transistors and a controller configured to control each one of the transistors with an individual control signal, wherein each of the write drivers is configured to provide different a smaller amount of current for accessing a first memory cell of the memory cells and to provide a larger amount of current larger than the smaller amount for accessing a second memory cell of the memory cells, and wherein the first memory cell is connected to the memory line at a smaller distance to the end of the memory line along the memory line than the second memory cell.

14. The memory device according to claim 13, wherein the plurality of transistors comprises one or more transistors having a first transistor width and one or more transistors having a second transistor width.

15. The memory device according to claim 13, wherein the controller is configured to:

control the write driver to output a shorter voltage pulse, which results in a shorter current duration, for providing the smaller amount of current; and control the write driver to output a longer voltage pulse, which results in a longer current duration, for providing the larger amount of current.

16. The memory device according to claim 13, wherein the memory cells comprise voltage-controlled magnetic anisotropy memory cells, phase change memory cells, spin-orbit torques memory cells, or spin-transfer torque memory cells.

\* \* \* \* \*